United States Patent
Hsieh

(10) Patent No.: US 11,952,295 B2
(45) Date of Patent: Apr. 9, 2024

(54) CONTROL SYSTEM OF DUAL POWER SUPPLY TYPE ELECTROLYZER

(71) Applicant: Dartpoint Tech. Co., Ltd., Taipei (TW)

(72) Inventor: Chung-Hsin Hsieh, Taipei (TW)

(73) Assignee: DARTPOINT TECH. CO., LTD., Taipei (TW)

( * ) Notice: Subject to any disclaimer, the term of this patent is extended or adjusted under 35 U.S.C. 154(b) by 170 days.

(21) Appl. No.: 17/504,774

(22) Filed: Oct. 19, 2021

(65) Prior Publication Data

US 2022/0119286 A1 Apr. 21, 2022

Related U.S. Application Data

(60) Provisional application No. 63/093,799, filed on Oct. 20, 2020.

(51) Int. Cl.
*C02F 1/461* (2023.01)
*C02F 1/467* (2023.01)
*C02F 103/42* (2006.01)
*H03K 3/017* (2006.01)

(52) U.S. Cl.
CPC ........ *C02F 1/46104* (2013.01); *C02F 1/4674* (2013.01); *H03K 3/017* (2013.01); *C02F 2103/42* (2013.01); *C02F 2201/4613* (2013.01); *C02F 2201/46135* (2013.01); *C02F 2201/4614* (2013.01); *C02F 2209/006* (2013.01); *C02F 2209/05* (2013.01); *C02F 2303/04* (2013.01)

(58) Field of Classification Search
CPC ................ C02F 1/46014; C02F 1/4674; C02F 2201/4613
See application file for complete search history.

(56) References Cited

U.S. PATENT DOCUMENTS

| | | | |
|---|---|---|---|
| 2009/0038944 A1* | 2/2009 | Kruger | C02F 1/4602 204/555 |
| 2018/0009681 A1* | 1/2018 | Cam | B03C 11/00 |
| 2019/0106339 A1* | 4/2019 | Cosentino | C02F 1/4674 |

FOREIGN PATENT DOCUMENTS

| | | | | |
|---|---|---|---|---|
| WO | WO-2006058369 A1 * | 6/2006 | | C25B 15/02 |
| WO | WO-2015038715 A1 * | 3/2015 | | C02F 1/4691 |

OTHER PUBLICATIONS

EP 2533036 A1—see translation (Year: 2012).*

* cited by examiner

*Primary Examiner* — Nicholas A Smith
(74) *Attorney, Agent, or Firm* — BACON & THOMAS, PLLC

(57) ABSTRACT

A control system of a dual power supply type electrolyzer includes an electrolyzer, a first power supply circuit, and a second power supply circuit. The electrolyzer includes a first electrode and a second electrode. The first power supply circuit connected to the first electrode. The second power supply circuit connected to the second electrode. The first power supply circuit and the second power supply circuit simultaneously supply power respectively to the first electrode and the second electrode. The first electrode and the second electrode have a same amount of power, but the first electrode and the second electrode have different polarities and their polarities alternate periodically.

25 Claims, 6 Drawing Sheets

CONTROL SYSTEM OF DUAL POWER SUPPLY TYPE ELECTROLYZER

CROSS REFERENCE TO RELATED APPLICATION

This application claims the benefit of filing date of U.S. Provisional Application Ser. No. 63/093,799, entitled "CONTROL DEVICE OF DUAL POWER SUPPLY TYPE ELECTROLYZER AND CONTROL METHOD THEREOF" filed Oct. 20, 2020 under 35 USC § 119(e)(1).

BACKGROUND OF THE INVENTION

1. Field of the Invention

The present invention relates to a control system of power supply, particularly for an electrolyzer of a chlorinator.

2. Description of Related Art

A chlorinator is a machine that can generate chlorine into the water for sterilizing a water pool such as a swimming pool, a bath pool, a SPA pool, and so on.

Generally, as shown in FIG. 1, a conventional power supply 11 used to control the electrolysis 12 by a chlorinator 1 can only generate a unidirectional direct current (DC).

In order to mitigate or obviate scale formation on the cathode electrode A of the chlorinator 1, a known solution is to add a polarity inversion switching circuit 13 into the chlorinator 1, wherein the polarity inversion switching circuit 13 is designed to invert the polarities of the electrodes A, B, so as to reduce or remove the scale formation on the cathode electrode A. The timing diagram of the powers generated by the polarity inversion switching circuit 13 and applied to the electrodes A, B is shown in FIG. 2, wherein the horizontal axis represents time and the vertical axis represents powers varying from 0% to 100%.

However, such solution has two serious disadvantages:
(1) Since the voltages on the electrodes A, B is a unidirectional DC type, there are relatively great voltage stresses occurring on the electrodes A, B, and the unidirectional operation can easily damage the electrodes A, B themselves and the coating on their surfaces; and
(2) The polarity inversion used to remove the scale formation is usually implemented by relay related electrical circuitry, but the life of the relay related electrical circuitry can be easily shortened under the great conducting current and the frequent inversion operation.

Therefore, it is desirable to provide an improved control system of power supply for a chlorinator to mitigate and/or obviate the aforementioned problems.

SUMMARY OF THE INVENTION

In order to solve the prior art problems, the present invention proposes a control system of dual power supply type electrolyzer, such that the prior art polarity inversion switching circuit is not necessary anymore. At the same time, the present invention can reduce the voltage stresses occurring on the electrodes by 30% to 50%, which extends the service life of a chlorinator, and reduces its maintenance work.

According to one aspect of the present invention, there is provided a control system of a dual power supply type electrolyzer, comprising an electrolyzer, a first power supply circuit, and a second power supply circuit. The electrolyzer includes a first electrode and a second electrode. The first power supply circuit connected to the first electrode. The second power supply circuit connected to the second electrode. The first power supply circuit and the second power supply circuit simultaneously supply power respectively to the first electrode and the second electrode. The first electrode and the second electrode have a same amount of power, but the first electrode and the second electrode have different polarities and their polarities alternate periodically.

Other objects, advantages, and novel features of the invention will become more apparent from the following detailed description when taken in conjunction with the accompanying drawings.

DETAILED DESCRIPTION OF THE EMBODIMENT

Figure 1:
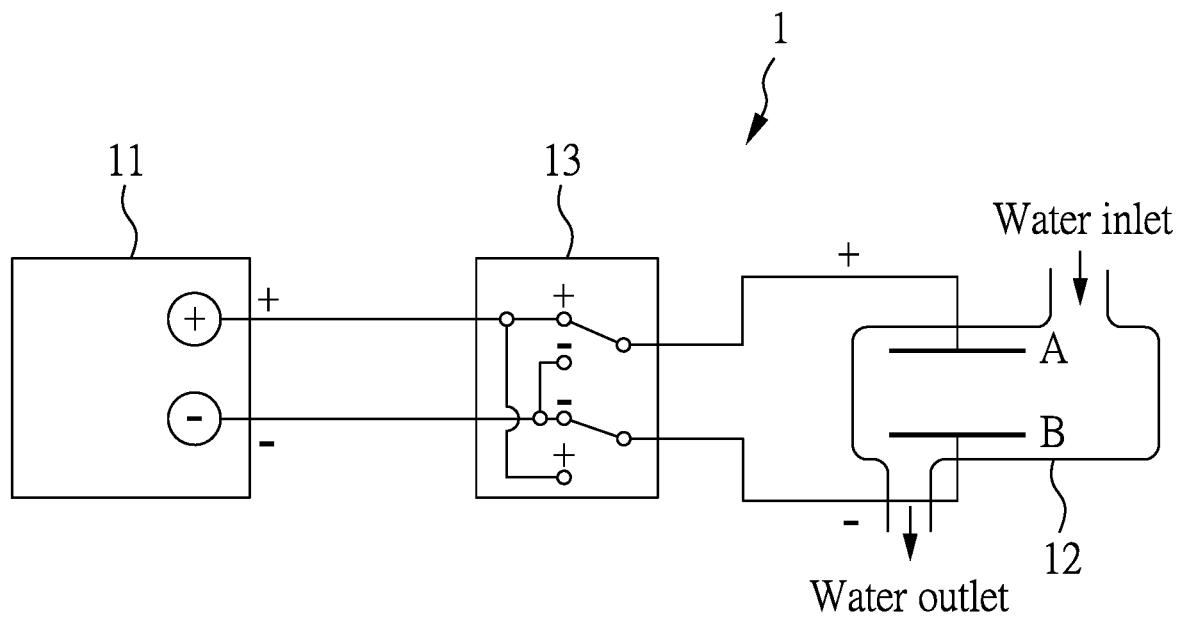
FIG. 1 is a circuit diagram of a prior art chlorinator having a conventional power supply and a polarity inversion switching circuit.

Different embodiments of the present invention are provided in the following description. These embodiments are meant to explain the technical content of the present invention, but not meant to limit the scope of the present invention. A feature described in an embodiment may be applied to other embodiments by suitable modification, substitution, combination, or separation.

It should be noted that, in the present specification, when a component is described to have an element, it means that the component may have one or more of the elements, and it does not mean that the component has only one of the element, except otherwise specified.

Moreover, in the present specification, the ordinal numbers, such as "first" or "second", are used to distinguish a plurality of elements having the same name, and it does not means that there is essentially a level, a rank, an executing order, or an manufacturing order among the elements, except otherwise specified. A "first" element and a "second" element may exist together in the same component, or alternatively, they may exist in different components, respectively. The existence of an element described by a greater ordinal number does not essentially means the existent of another element described by a smaller ordinal number.

Moreover, in the present specification, the terms, such as "top", "bottom", "left", "right", "front", "back", or "middle", as well as the terms, such as "on", "above", "under", "below", or "between", are used to describe the relative positions among a plurality of elements, and the described relative positions may be interpreted to include their translation, rotation, or reflection.

Moreover, in the present specification, when an element is described to be arranged "on" another element, it does not essentially means that the elements contact the other element, except otherwise specified. Such interpretation is applied to other cases similar to the case of "on".

Moreover, in the present specification, the terms, such as "preferably" or "advantageously", are used to describe an optional or additional element or feature, and in other words, the element or the feature is not an essential element, and may be ignored in some embodiments.

Moreover, in the present specification, when an element is described to be "suitable for" or "adapted to" another element, the other element is an example or a reference helpful in imagination of properties or applications of the element, and the other element is not to be considered to form a part of a claimed subject matter; similarly, except otherwise specified; similarly, in the present specification, when an element is described to be "suitable for" or "adapted to" a configuration or an action, the description is made to focus on properties or applications of the element, and it does not essentially mean that the configuration has been set or the action has been performed, except otherwise specified.

Moreover, each component may be realized as a single circuit or an integrated circuit in suitable ways, and may include one or more active elements, such as transistors or logic gates, or one or more passive elements, such as resistors, capacitors, or inductors, but not limited thereto. Each component may be connected to each other in suitable ways, for example, by using one or more traces to form series connection or parallel connection, especially to satisfy the requirements of input terminal and output terminal. Furthermore, each component may allow transmitting or receiving input signals or output signals in sequence or in parallel. The aforementioned configurations may be realized depending on practical applications.

Moreover, in the present specification, the terms, such as "system", "apparatus", "device", "module", or "unit", refer to an electronic element, or a digital circuit, an analogous circuit, or other general circuit, composed of a plurality of electronic elements, and there is not essentially a level or a rank among the aforementioned terms, except otherwise specified.

Moreover, in the present specification, two elements may be electrically connected to each other directly or indirectly, except otherwise specified. In an indirect connection, one or more elements, such as resistors, capacitors, or inductors may exist between the two elements. The electrical connection is used to send one or more signals, such as DC or AC currents or voltages, depending on practical applications.

Moreover, in the present specification, a value may be interpreted to cover a range within ±10% of the value, and in particular, a range within ±5% of the value, except otherwise specified; a range may be interpreted to be composed of a plurality of subranges defined by a smaller endpoint, a smaller quartile, a median, a greater quartile, and a greater endpoint, except otherwise specified.

(Basic System)

Figure 3:
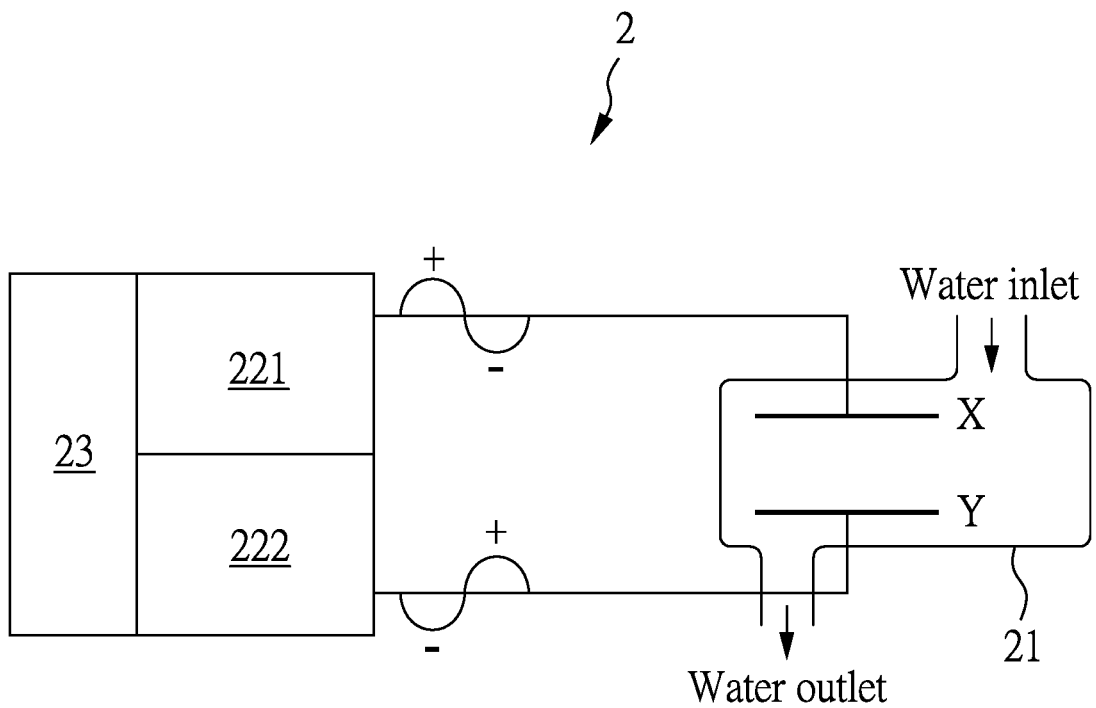
FIG. 3 is a circuit diagram of the control system of the dual power supply type electrolyzer in the chlorinator according to one embodiment of the present invention.

FIG. 3 is a circuit diagram of the control system 20 of the dual power supply type electrolyzer in the chlorinator 2 according to one embodiment of the present invention.

As shown in FIG. 3, the chlorinator 2 mainly includes an electrolyzer 21 with a first electrode X and a second electrode Y to perform electrolysis, a first power supply circuit 221 and a second power supply circuit 222. Each of the electrodes X, Y may be a clip, a plate, or a set of clips or plates. The first power supply circuit 221 is connected to and provides power to the first electrode X. The second power supply circuit 222 is connected to and provides power to the second electrode Y. Preferably, the chlorinator 2 may further include a synchronization circuit 23 connected both to the first power supply circuit 221 and the second power supply circuit 222 so as to synchronize their signal timings. The first power supply circuit 221, the second power supply circuit 222, and the synchronization circuit 23 may be controlled by a microcontroller (not shown in FIG. 3).

Figure 4:
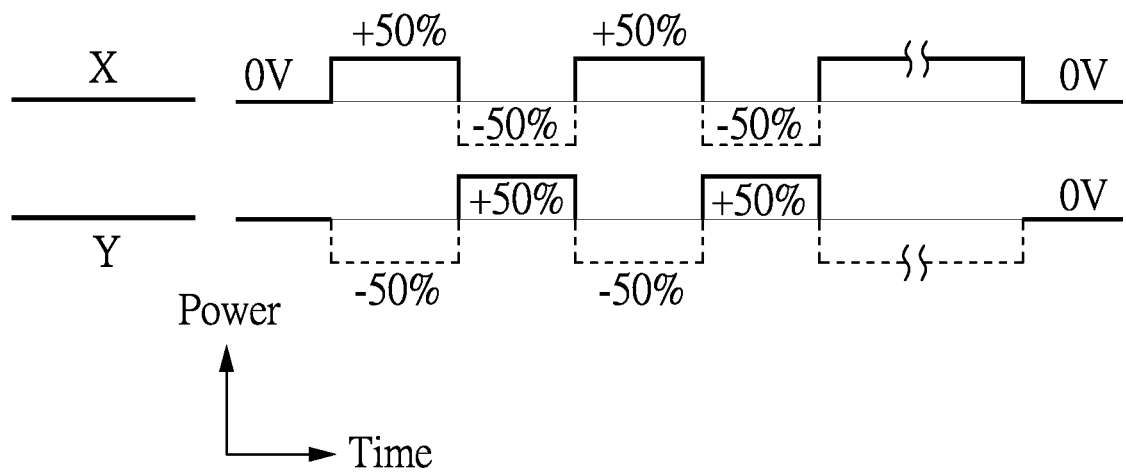
FIG. 4 is a timing diagram of the powers in square waveform generated respectively by the first power supply circuit and the second power supply circuit and applied to the first electrode and the second electrode.

FIG. 4 is a timing diagram of the powers in square waveform generated respectively by the first power supply circuit 221 and the second power supply circuit 222 and applied to the first electrode X and the second electrode Y.

Figure 2:
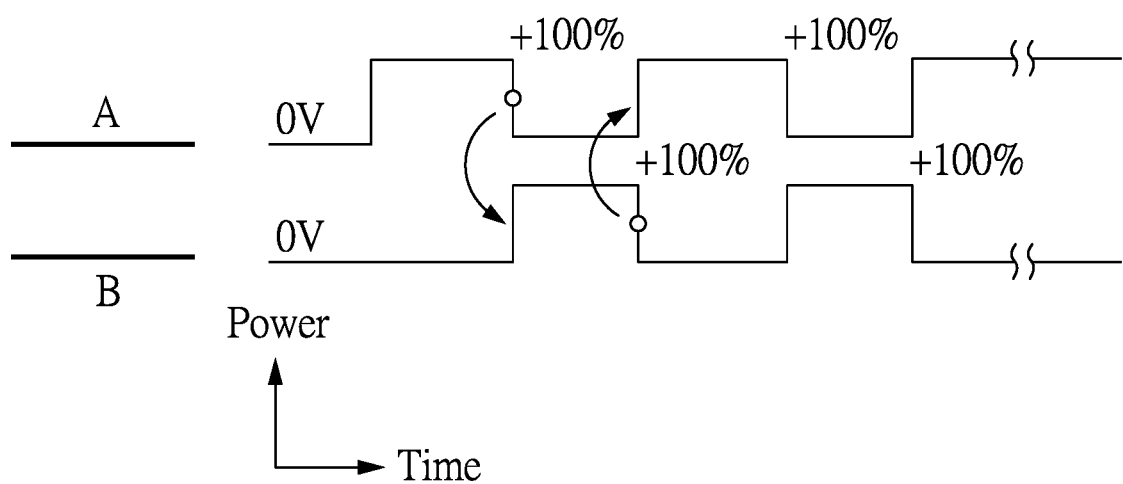
FIG. 2 is a timing diagram of the powers generated by the polarity inversion switching circuit and applied to the electrodes of the prior art chlorinator.

Referring both to FIGS. 3 and 4, the first power supply circuit 221 and the second power supply circuit 222 simultaneously supply power respectively to the first electrode X and the second electrode Y, but the respective supplied power is half (+50% or −50%) of the conventional power as shown in FIG. 2. The first electrode X and the second electrode Y have a same amount of power (that is, their absolute values are the same), but the first electrode X and the second electrode Y have different polarities (that is, one is inverted from another), and their polarities alternate (or change) periodically so as to realize the polarity inversion. In this way, since the periodically alternating polarities are generated directly by the power supply circuits 221, 222, there is no need of the polarity inversion switching circuit 13 as shown in FIG. 1.

In addition to square waveform and sinusoidal waveform, it is also possible to use triangle waveform, or trapezoidal waveform.

Figure 5:
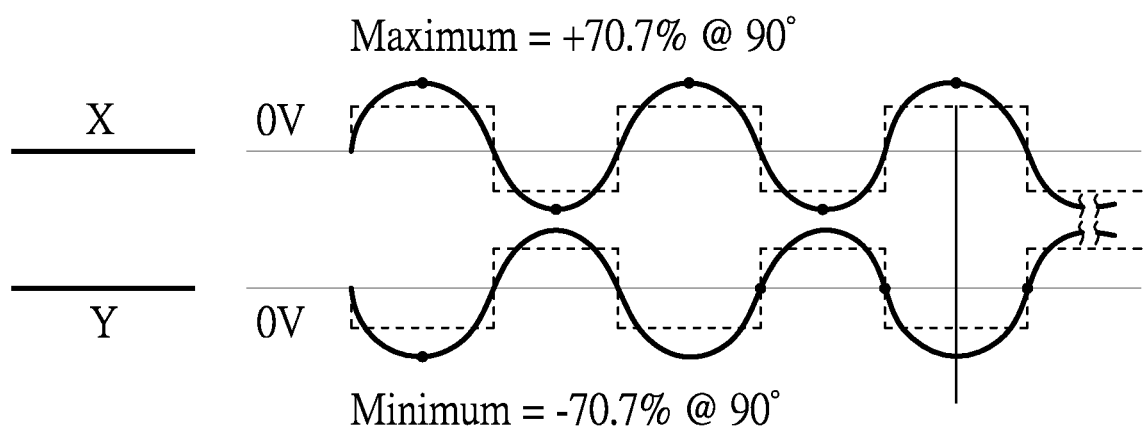
FIG. 5 is a timing diagram of the powers in sinusoidal waveform generated respectively by the first power supply circuit and the second power supply circuit and applied to the first electrode and the second electrode.

FIG. 5 is a timing diagram of the powers in sinusoidal waveform generated respectively by the first power supply circuit 221 and the second power supply circuit 222 and applied to the first electrode X and the second electrode Y.

Referring both to FIGS. 3 and 5, considering that powers in square waveform may cause stress concentration on the electrodes X, Y at the moment when the powers are inputted into the electrodes X, Y, and thus shorten their service lives, it is preferably to change square waveform into sinusoidal waveform. Similarly, the first electrode X and the second electrode Y receive the powers in sinusoidal waveforms of opposite phases. The powers at the peak point and the valley point of the sinusoidal waveform is respectively about +70.7% and −70.7% of the conventional power as shown in FIG. 2. Since the powers change slowly at each time point, it can avoid the problem of stress concentration on the electrodes X, Y.

(Operation Method)

Figure 6:
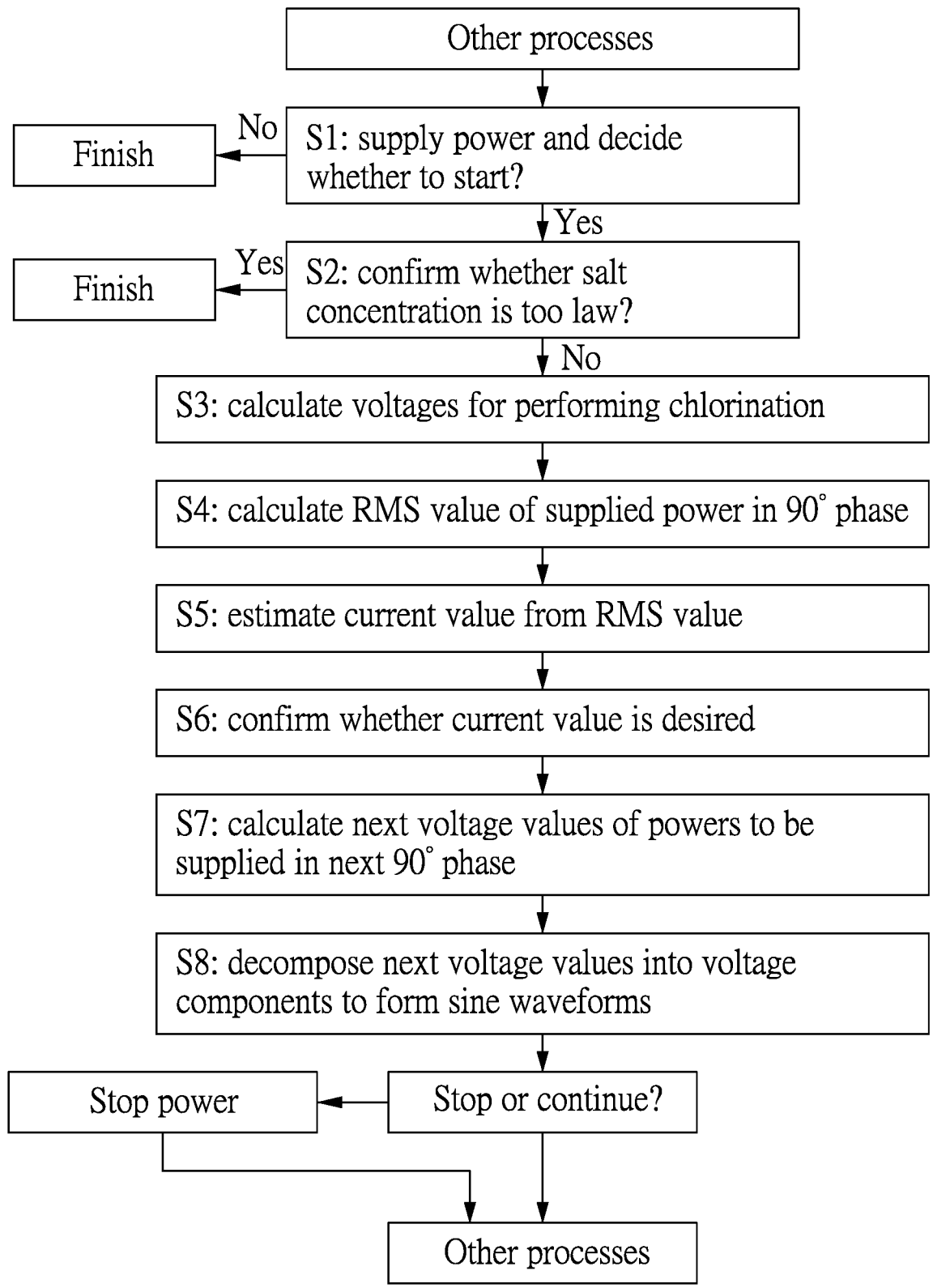
FIG. 6 is a flow chart of the control method of the dual power supply type electrolyzer in the chlorinator according to one embodiment of the present invention.

FIG. 6 is a flow chart of the control method of the dual power supply type electrolyzer in the chlorinator according to one embodiment of the present invention. The control method is performed by a microcontroller of the chlorinator.

The control method of the present invention may enter Step S1 from other processes.

Step S1 is to supply electrolysis power to the chlorinator 2 and to decide whether to start chlorination or not. The decision may be made automatically by the microcontroller or manually by a user. If the chlorination is considered not necessary at the moment, then the control method is finished. If the chlorination is considered necessary at the moment, then the control method enters Step S2.

Step S2 is to measure and confirm whether salt concentration is too low, that is, lower than a predetermined value, wherein the predetermined value shall be set depending on practical applications. The salt concentration is typically represented by parts per million (ppm), but not limited thereto. If the salt concentration is too low, it means that it is not suitable to perform the chlorination, then the control method is finished. If the salt concentration is enough to perform the chlorination, then the control method enters Step S3.

Step S3 is to calculate voltage values supplied to the electrodes X, Y for performing the chlorination under such salt concentration. Preferably, the practically supplied voltage values may be set to 105% to 110% of the calculated voltage values to ensure the performance of the chlorination.

Then, Step S4 is to calculate a root mean square (RMS) value within previous 90 degree phase (as a time interval) of the supplied power.

Then, Step S5 is to estimate a current value from the RMS value.

Then, Step S6 is to confirm whether the estimated current value is a desired value.

Then, Step S7 is to calculate next voltage values of power to be supplied within next 90 degree phase (as a time interval). The next voltage values can be calculated by converting the estimated current value in Step S6.

Then, Step S8 is to decompose the next voltage values into a plurality of voltage components to form sinusoidal waveforms for the electrodes X, Y.

Then, Step S9 is to decide to continue or stop the chlorination. If the chlorination is considered can be stopped, then the control method finishes and the electrolysis power stops as well. Other processes may begin. Otherwise, the chlorination may continue by previous steps.

(Detailed System)

Figure 7:
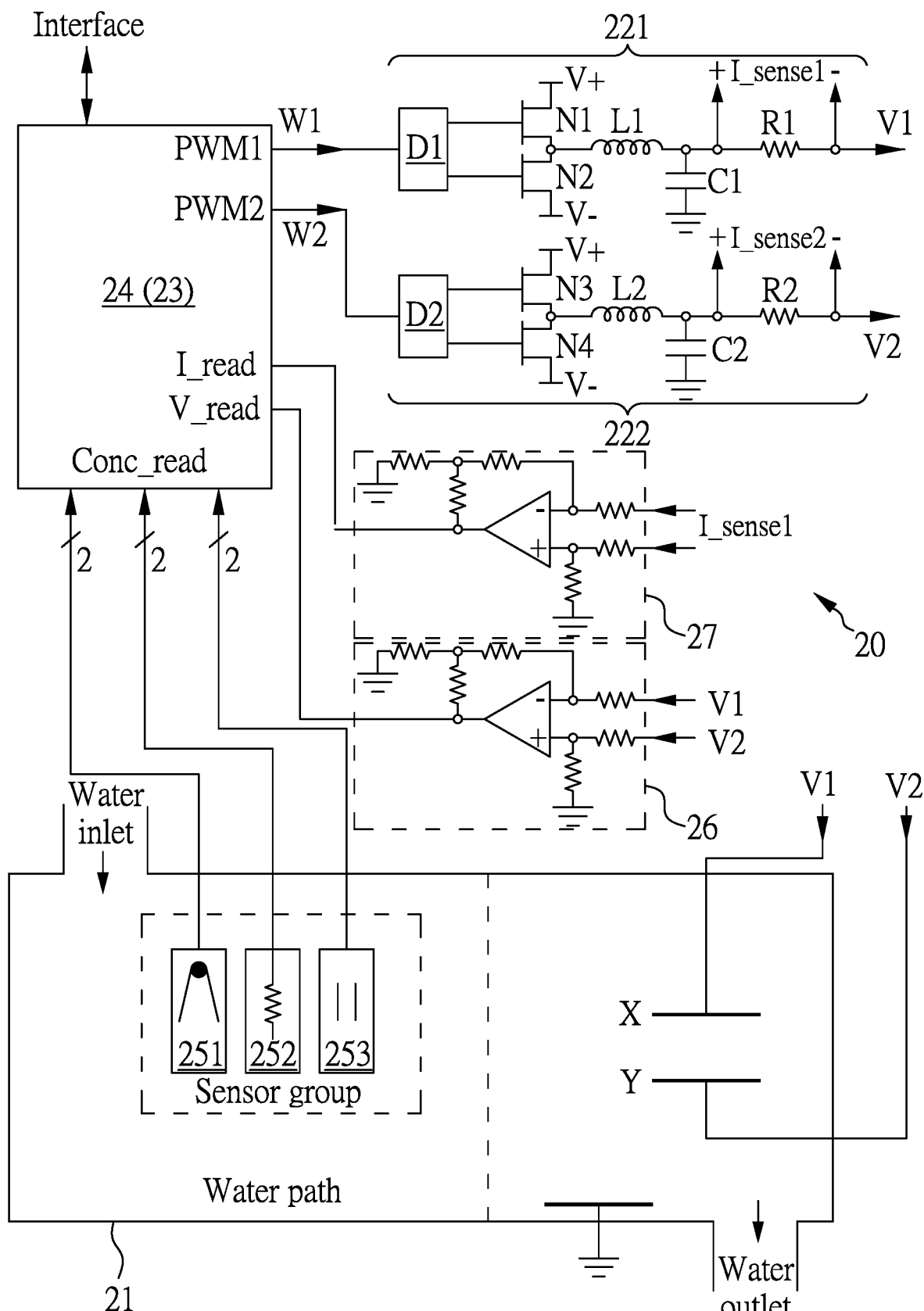
FIG. 7 is a detailed circuit diagram of the control system of the dual power supply type electrolyzer in the chlorinator according to one embodiment of the present invention.

FIG. 7 is a detailed circuit diagram of the control system 20 of the dual power supply type electrolyzer in the chlorinator 2 according to one embodiment of the present invention.

An electrolyzer 21 in the chlorinator 2 is typically filled with water. The water may be added with salt and becomes an electrolytic solution for chlorination. In electricity aspect, the water itself may serve as the ground, but there may still be an individual ground electrode in the electrolyzer 21. The electrolyzer 21 mainly includes a first electrode X, a second electrode Y, respectively applied with voltages V1, V2 for performing electrolyze the salt in the water in the electrolyzer 21 for chlorination.

The control system 20 of the present invention includes a microcontroller 24, and a first power supply circuit 221 and a second power supply circuit 222 both connected to and controlled by the microcontroller 24. In this embodiment, the microcontroller 24 serves as the synchronization circuit 23 as shown in FIG. 3, and the microcontroller 24 implements the synchronization function by way of software.

The microcontroller 24 has an interface port that can receive control signals from a panel or a host computer.

The microcontroller 24 has a plurality of input ports, I_read, V_read, and/or Conc_read, for reading current I_sense1 (or I_sense2), voltages V1, V2, and/or salt concentration. The voltage V1, V2 may enter from an amplifier circuit 26, the sensed current I_sense1 (or I_sense2) may enter from an amplifier circuit 27, and the structures of the amplifier circuits 26, 27 can be seen in FIG. 7, so their detailed descriptions are deemed unnecessary here. The salt concentration may be measured by a concentration meter 253, preferably accompanied with a flow switch 251 and/or a temperature sensor 252, which are arranged on a water path of the electrolyzer 21 in the chlorinator.

The microcontroller 24 has at least two output ports PWM1, PWM2. The microcontroller 24 outputs a first signal W1 with a first phase P1 from the output port PWM1 into the first power supply circuit 221, and a second signal W2 with a second phase P2 from the output port PWM2 into the second power supply circuit 222. The signals W1, W2 have pulse width modulation (PWM) waveforms with 180 degree phase difference between them.

The first power supply circuit 221 includes a floating gate driver D1, two power transistors N1, N2, an inductor L1, a capacitor C1, and a current sensing resistor R1. The floating gate driver D1 may be an integrated circuit (IC) chip, and may be chosen from a conventional IC chip, such as IR2111. The floating gate driver D1 has one input to receive the first signal W1, and two outputs. The power transistor N1 may be an NMOS transistor with its gate connected to one output of the floating gate driver D1, its drain connected to a constant high voltage V+, and its source connected to a first end of the inductor L1. The power transistor N2 may be an NMOS transistor with its gate connected to another output of the floating gate driver D1, its drain connected to the first end of the inductor L1, and its source connected to a constant low voltage V−. A second end of the inductor L1 is connected to a first end of the capacitor C1 and a first end of the current sensing resistor R1. A second end of the capacitor C1 is connected to the ground. Therefore, going through the entire circuit of the first power supply circuit 221, the first signal W1 becomes the first voltage V1 outputted from a second end of the current sensing resistor R1 and finally applied onto the first electrode X. Besides, there is I_sense1 that may be a current measured across the current sensing resistor R1.

Similarly, the second power supply circuit 222 includes a floating gate driver D2, two power transistors N3, N4, an inductor L2, a capacitor C2, and a current sensing resistor R2. The floating gate driver D2 may be an integrated circuit (IC) chip, and may be chosen from a conventional IC chip, such as IR2111. The floating gate driver D2 has one input to receive the second signal W2, and two outputs. The power transistor N3 may be an NMOS transistor with its gate connected to one output of the floating gate driver D2, its drain connected to a constant high voltage V+, and its source connected to a first end of the inductor L2. The power transistor N4 may be an NMOS transistor with its gate connected to another output of the floating gate driver D2, its drain connected to the first end of the inductor L2, and its source connected to a constant low voltage V−. A second end of the inductor L2 is connected to a first end of the capacitor C2 and a first end of the current sensing resistor R2. A second end of the capacitor C2 is connected to the ground. Therefore, going through the entire circuit of the second power supply circuit 222, the second signal W2 becomes the second voltage V2 outputted from a second end of the current sensing resistor R2 and finally applied onto the second electrode Y. Besides, there is I_sense2 that may be a current measured across the current sensing resistor R2.

Figure 8:
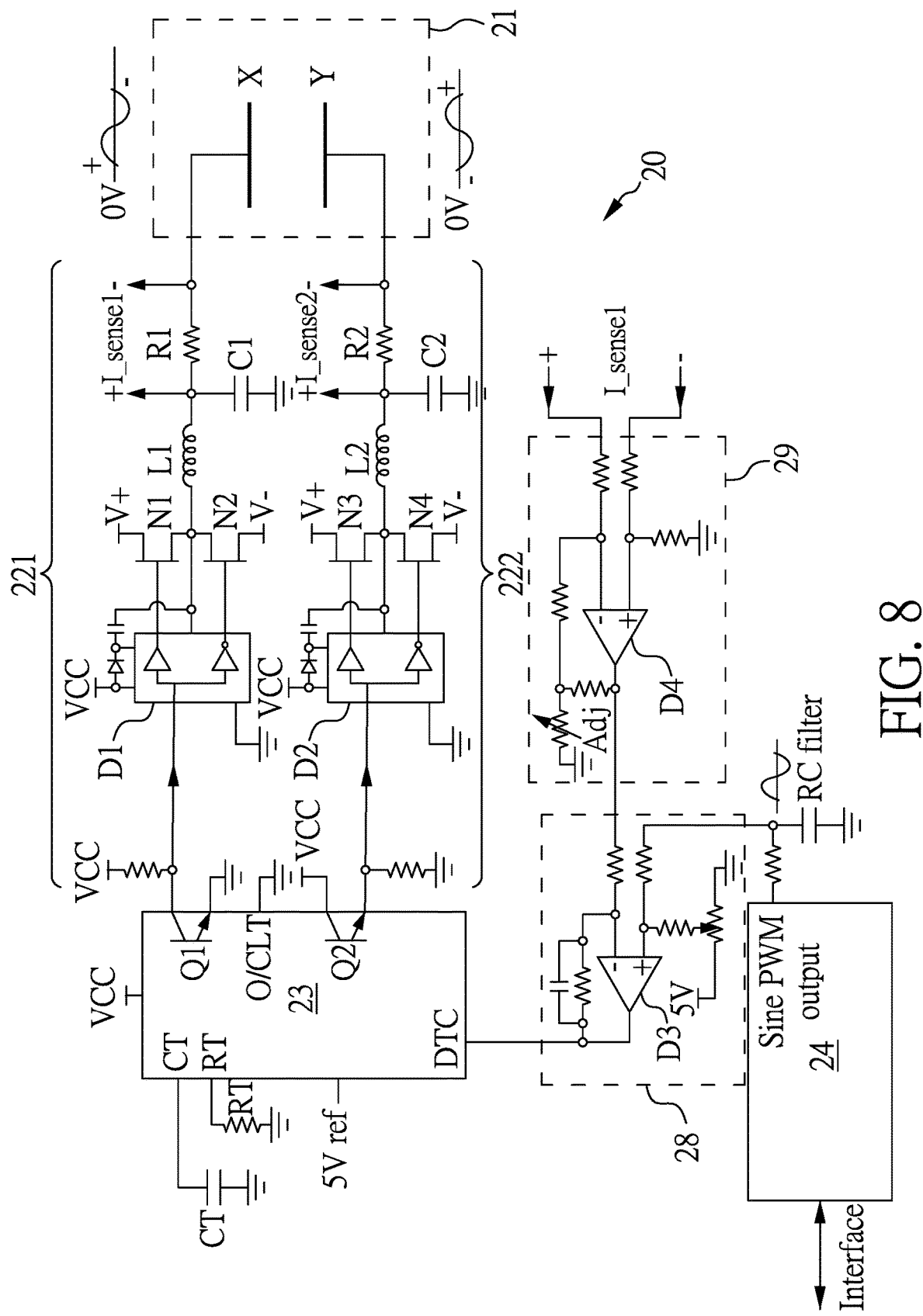
FIG. 8 is a detailed circuit diagram of the control system of the dual power supply type electrolyzer in the chlorinator according to another embodiment of the present invention.

The floating gate drivers D2 may include a diode and a capacitor, as shown in FIG. 8, to realize a floating voltages for the power transistors N1, N3, which are up-side power transistors.

(Detailed System)

FIG. 8 is a detailed circuit diagram of the control system of the dual power supply type electrolyzer in the chlorinator according to another embodiment of the present invention.

The control system 20 of the present invention includes a microcontroller 24, a synchronization circuit 23 connected to the microcontroller 24, and a first power supply circuit 221 and a second power supply circuit 222 both connected to the synchronization circuit 23. This embodiment of FIG. 8 is different from the previous embodiment of FIG. 7 since the synchronization function is implemented by the synchronization circuit 23 in this embodiment of FIG. 8 rather than the microcontroller 24 itself in the previous embodiment of FIG. 7.

In this embodiment of FIG. 8, the microcontroller 24 has an interface port that can receive control signals from a panel or a host computer, and an output port to output a sinusoidal (sine) PWM signal according to the control signals. The sine PWM signal is shifted such that its peak (or maximum) represents 100% power and its valley (or minimum) represents 0% power. The sine PWM signal then goes through an RC filter to become a sine control signal with a period of about 5 to 10 minutes.

The sine control signal is inputted into a current feedback control circuit 28 and serves as a referential signal for the current feedback control circuit 28. The current feedback control circuit 28 may be of proportional-integral-derivative (PID) type or Type I/II/III. In this case, for example, the current feedback control circuit 28 is formed by an amplifier D3 and a plurality of connected resistors.

The synchronization circuit 23 is implemented in a PWM control circuit. A triangular waveform signal generating circuit formed of a capacitor CT and a resistor RT is connected to and provides a triangular waveform signal to the PWM control circuit. The PWM control circuit is configured to compare an output of current feedback control circuit with a triangular waveform signal, and generate a positive output signal having an appropriate duty (50%±Δ%). The PWM control circuit is also configured to generate a negative output signal having another duty by adjusting the duty of the positive output signal. It can be seen that, the PWM control circuit has a dead time control (DTC) input port to control Q1, Q2 duties by comparing with D3 output to generate PWM duty from about 0% to about 100%.

The circuit structures of the first power supply circuit 221 and the second power supply circuit 222 in this embodiment of FIG. 8 are almost the same as those in the previous embodiment of FIG. 7. In FIG. 8, each of the floating gate drivers D1, D2 includes a diode and a capacitor to realize a floating voltages for the power transistors N1, N3 which are up-side power transistors.

Throughout the first power supply circuit 221, a signal from the transistor Q1 is used to drive the floating gate drivers D1. The floating gate drivers D1 can generate a positive signal to the power transistor N1, and a negative signal to the power transistor N2. The power transistors N1, N2 form a synchronous rectifier that outputs a PWM power signal. The PWM power signal goes through an inductor L1, a capacitor C1, and then becomes a first supplied voltage V1 in a sinusoidal waveform provided to the first electrode X.

On the contrary, throughout the second power supply circuit 222, starting from a signal from the transistor Q2, up to a second supplied voltage V2 in a sinusoidal waveform provided to the second electrode Y, the signals in the second power supply circuit 222 each has 180 degree phase difference (that is, inverted phase) with respect to those in the first power supply circuit.

A current goes from the first electrode X with the first supplied voltage V1, through an electrolytic solution (or water), and arrived the second electrode Y with the second supplied voltage V2.

The first power supply circuits 221 has a current sensing resistor R1 to measure respective a sensed current I_sense. A differential amplifier 29 formed of an amplifier D4 and a plurality of connected resistors and having a high input resistance can be added to amplify the sensed current I_sense to an appropriate amount to cooperate with the current feedback control circuit 28. The sensed current I_sense is then sent to the current feedback control circuit 28 for it to compare the sensed current I_sense with the sine control signal.

(Additional Method)

The present invention also provides a method to determine the performance of the electrodes X, Y. The method is executed by the microcontroller 24 as shown in FIG. 7, and other elements mentioned in the method may also be referred to FIG. 7, but the method may also be used in FIG. 8.

Step T1 is to read salt concentrate from the concentrate meter 253.

Step T2 is to set the PWM signals W1, W2 each having low current and high frequency from hundreds of Hz to thousands of Hz which are respectively used to generate the voltages V1, V2.

Step T3 is to measure the voltages V1, V2 and the sensed current I_sense1.

Step T4 is to calculate I_sense1/(V1-V2) and derive a measured conductance between the electrodes X, Y in the electrolyzer 21.

Step T5 is to convert the salt concentrate in Step T1 into a converted conductance, and then compare the measured conductance with the converted conductance, particularly by calculating a difference between them. The ratio of the difference can be understood as the loss ratio of the electrodes X, Y.

Although the present invention has been explained in relation to its preferred embodiment, it is to be understood that many other possible modifications and variations can be made without departing from the spirit and scope of the invention as hereinafter claimed.

What is claimed is:

1. A control system of a dual power supply type electrolyzer, comprising:

an electrolyzer, including a first electrode and a second electrode;

a first power supply circuit connected to the first electrode and configured to output a first alternating waveform; and a second power supply circuit connected to the second electrode and configured to output a second alternating waveform;

wherein the first power supply circuit and the second power supply circuit simultaneously supply power respectively to the first electrode and the second electrode, the first electrode and the second electrode have the same amount of power, but the first electrode and the second electrode have different polarities and their polarities alternate periodically;

wherein signals throughout the second power supply circuit each has 180 degree phase difference with respect to signals throughout the first power supply circuit.

2. The control system of claim 1, wherein absolute values of the powers of the first electrode and the second electrode are summed up to be 100%.

3. The control system of claim 2, wherein the powers of the first electrode and the second electrode are supplied in square waveform, sinusoidal waveform, triangle waveform, or trapezoidal waveform.

4. The control system of claim 1, further comprising a synchronization circuit connected both to the first power supply circuit and the second power supply circuit to synchronize their timings.

5. The control system of claim 1, wherein the first power supply circuit and the second power supply circuit each includes a floating gate driver, two power transistors connected to the floating gate driver, an inductor connected to the two power transistors, a capacitor connected to the inductor, and a current sensing resistor connected to the capacitor.

6. The control system of claim 5, wherein the floating gate driver is an integrated circuit chip and is connected with a diode and another capacitor to realize a floating voltage for an up-side power transistor.

7. The control system of claim 5, wherein a sensed current is measure across the current sensing resistor.

8. The control system of claim 5, wherein the synchronization circuit is implemented by a microcontroller.

9. The control system of claim 8, wherein the microcontroller has a plurality of input ports for reading current, voltages, and/or salt concentration respectively measured by different kinds of meters and/or sensors; at least two output ports to output a first signal with a first phase into the first power supply circuit and a second signal with a second phase into the second power supply circuit.

10. The control system of claim 9, wherein the first signal and the second signal have pulse width modulation (PWM) waveforms with 180 degree phase difference between them.

11. The control system of claim 5, further comprising a microcontroller connected to the first power supply circuit, the second power supply circuit, and a synchronization circuit, wherein the synchronization circuit and the microcontroller are separated circuits.

12. The control system of claim 11, wherein the microcontroller outputs a sinusoidal (sine) PWM signal.

13. The control system of claim 12, wherein the sine PWM signal is shifted such that its peak (or maximum) represents 100% power and its valley (minimum) represents 0% power, and the sine PWM signal then goes through an RC filter to become a sine control signal with a period of 5 to 10 minutes.

14. The control system of claim 13, wherein the sine control signal is inputted into a current feedback control circuit and serves as a referential signal for the current feedback control circuit.

15. The control system of claim 14, wherein the current feedback control circuit is formed by an amplifier and a plurality of connected resistors.

16. The control system of claim 14, wherein the synchronization circuit is implemented in a PWM control circuit.

17. The control system of claim 16, wherein the PWM control circuit is configured to compare an output of current feedback control circuit with a triangular waveform signal received from a triangular waveform signal generating circuit, and generate a positive output signal and a negative output signal.

18. The control system of claim 16, wherein the PWM control circuit has a dead time control (DTC) input port to compare with an output of the current feedback control circuit to generate PWM duty from about 0% to 100%.

19. The control system of claim 7, further comprising a differential amplifier formed of an amplifier and a plurality of connected resistors and having a high input resistance to amplify the sensed current to an amount to cooperate with the current feedback control circuit.

20. The control system of claim 11, wherein the microcontroller is configured to perform a control method to generate the powers for the first electrode and the second electrode.

21. The control system of claim 20, wherein the control method includes a step to decide whether salt concentration is lower than a predetermined value.

22. The control system of claim 20, wherein the control method includes a step to calculate voltage values supplied to the first electrode and the second electrode for performing chlorination under a specific salt concentration.

23. The control system of claim 20, wherein the control method includes a step to calculate root mean square (RMS) value during previous 90 degree phase of the supplied power; a step to estimate current value from the RMS value; a step to decide whether the estimated current value is a desired value.

24. The control system of claim 23, wherein the control method includes a step to calculate next voltage values for power to be supplied in next 90 degree phase by converting the estimated current value.

25. The control system of claim 10, wherein the microcontroller is configured to perform a control method to determine the performance of the electrodes, by a step to read salt concentration from a concentration meter; a step to set PWM signals W1, W2 each having low current and high frequency which are respectively used to generate the first voltage and the second voltage; a step to measure the first voltage, the second voltage, and the sensed current; a step to derive a measured conductance from the first voltage, the second voltage, and the sensed current; and a step to convert the salt concentration into a converted conductance, and then compare the measured conductance with the converted conductance.

* * * * *